United States Patent
Sasaki (10) Patent No.: US 8,435,653 B2
(45) Date of Patent: May 7, 2013

(54) SPIN TRANSPORT ELEMENT

(75) Inventor: Tomoyuki Sasaki, Tokyo (JP)

(73) Assignee: TDK Corporation, Tokyo (JP)

( * ) Notice: Subject to any disclaimer, the term of this patent is extended or adjusted under 35 U.S.C. 154(b) by 139 days.

(21) Appl. No.: 13/044,927

(22) Filed: Mar. 10, 2011

(65) Prior Publication Data

US 2011/0244268 A1    Oct. 6, 2011

(30) Foreign Application Priority Data

Apr. 2, 2010    (JP) ................................. 2010-086301

(51) Int. Cl.
*H01L 29/82*    (2006.01)

(52) U.S. Cl.
USPC ..... 428/815; 428/816; 257/422; 257/E29.323

(58) Field of Classification Search ........................ None
See application file for complete search history.

(56) References Cited

U.S. PATENT DOCUMENTS

| | | | | |
|---|---|---|---|---|
| 5,862,022 A | * | 1/1999 | Noguchi et al. | 360/324.2 |
| 6,888,184 B1 | * | 5/2005 | Shi et al. | 257/293 |
| 7,492,631 B1 | * | 2/2009 | Assefa et al. | 365/171 |
| 7,522,392 B2 | * | 4/2009 | Carey et al. | 360/324.2 |
| 7,532,504 B2 | * | 5/2009 | Saito | 365/158 |
| 7,678,475 B2 | * | 3/2010 | Slavin et al. | 428/811 |
| 7,860,351 B2 | * | 12/2010 | Yagami | 382/325 |
| 8,238,064 B2 | * | 8/2012 | Yamada et al. | 360/324.2 |
| 2006/0022220 A1 | * | 2/2006 | Inomata et al. | 257/214 |
| 2006/0114018 A1 | | 6/2006 | Sugahara et al. | |
| 2007/0253121 A1 | * | 11/2007 | Yamada et al. | 360/324.11 |
| 2010/0296202 A1 | * | 11/2010 | Boone et al. | 360/313 |
| 2012/0074510 A1 | * | 3/2012 | Sasaki et al. | 257/422 |
| 2012/0228683 A1 | * | 9/2012 | Oikawa et al. | 257/295 |

FOREIGN PATENT DOCUMENTS

| | | |
|---|---|---|
| JP | B2-3818276 | 9/2006 |
| JP | B2-4143644 | 9/2008 |

\* cited by examiner

*Primary Examiner* — Kevin Bernatz
(74) *Attorney, Agent, or Firm* — Oliff & Berridge, PLC (57) ABSTRACT

A spin transport element 1 has a first ferromagnet 12A, a second ferromagnet 12B, a channel 7 extending from the first ferromagnet 12A to the second ferromagnet 12B, a magnetic shield S1 covering the channel 7, and an insulating film provided between the channel 7 and the magnetic shield S1.

9 Claims, 11 Drawing Sheets

SPIN TRANSPORT ELEMENT

BACKGROUND OF THE INVENTION

1. Field of the Invention

The present invention relates to a spin transport element.

2. Related Background Art

The spin transport elements are applied to a variety of products, e.g., HDD heads, magnetic sensors, MRAMs, and so on. The known spin transport elements are classified into those using spin current in association with electric current, and those using only spin current. A known element making use of spin current is configured with two ferromagnets arranged on a nonmagnetic conductor and with a space shorter than the spin diffusion length of this nonmagnetic conductor (e.g., cf. Japanese Patent No. 3818276). Furthermore, for example, a spin MOS-FET is known as a device using spins transported through a relatively long distance in a nonmagnetic conductor (e.g., cf. Japanese Patent No. 4143644).

SUMMARY OF THE INVENTION

Incidentally, a phenomenon of rotation of spins due to an external magnetic field (so called the Hanle effect) is known in the device using spins transported through a relatively long distance in the nonmagnetic conductor as described above. Particularly, where spins are transported through a semiconductor channel with a relatively long spin lifetime, the spins rotate even under influence of a very weak external magnetic field. Therefore, the spins retaining magnetization information of a ferromagnetic electrode rotate during transport through the semiconductor channel, which caused the problem that the magnetization information was not accurately transmitted, or they caused noise.

The present invention has been accomplished in order to solve the above problem and it is an object of the present invention to suppress the noise or error due to the external magnetic field entering the channel.

In order to solve the above problem, a spin transport element according to the present invention is a spin transport element comprising: a first ferromagnet; a second ferromagnet; a channel extending from the first ferromagnet to the second ferromagnet; a magnetic shield covering the channel; and an insulating film provided between the channel and the magnetic shield.

One of the foregoing first ferromagnet and second ferromagnet functions as an injecting electrode for injecting spins into the channel and the other functions as a receiving electrode for receiving spins from the channel. The channel functions as a portion in which spins injected from the first ferromagnet or the second ferromagnet are transported. The spins transported in the channel retain magnetization information of one of the first ferromagnet and the second ferromagnet. In this spin transport element, the channel is covered through the insulating film by the magnetic shield. For this reason, in situations where an external magnetic field can enter the channel, the spins under transport in the channel are prevented from rotating because of influence of the external magnetic field. Therefore, the magnetization information retained by the spins can be accurately transmitted in the channel. Accordingly, it is feasible to suppress the noise or error due to the entrance of the external magnetic field into the channel.

Preferably, the magnetic shield covers a surface of the channel parallel to a direction of magnetization of the first ferromagnet and a direction of magnetization of the second ferromagnet.

This configuration can efficiently prevent the spins under transport in the channel from rotating because of the external magnetic field.

Preferably, a material of the magnetic shield is a soft magnetic material containing one or more elements selected from the group consisting of Ni, Fe, and Co.

Use of these soft magnetic materials allows the magnetic shield to adequately block the external magnetic field from entering the channel.

Preferably, a material of the first ferromagnet and the second ferromagnet is any one of (1) to (3) below: (1) a metal selected from the group consisting of Cr, Mn, Co, Fe, and Ni; (2) an alloy containing one or more elements selected from the group consisting of Cr, Mn, Co, Fe, and Ni; (3) a compound containing one or more elements selected from the group consisting of Cr, Mn, Co, Fe, and Ni, and one or more elements selected from the group consisting of B, C, and N.

Since these materials are ferromagnetic materials with large spin polarizability, the function as the spin injecting electrode or the spin receiving electrode can be suitably realized.

Preferably, a material of the channel is a material containing one or more semiconductors selected from the group consisting of Si, Ge, GaAs, C, and ZnO.

Since these materials have a relatively long spin diffusion length, they allow the channel to suitably transport and accumulate spins.

Preferably, a barrier layer is formed between at least one of the first ferromagnet and the second ferromagnet, and the channel.

This allows many spin-polarized electrodes to be injected from at least one of the first ferromagnet and the second ferromagnet into the channel, thereby enhancing an output of the spin transport element.

Preferably, a material of the barrier layer is an oxide material containing at least one of Mg and Al. These materials can suitably improve injection efficiency of spins to be injected from at least one of the first ferromagnet and the second ferromagnet into the channel.

Preferably, a direction of magnetization of at least one of the first ferromagnet and the second ferromagnet is fixed by means of at least one of an antiferromagnet and shape anisotropy.

When the antiferromagnet is exchange-coupled with at least one of the first ferromagnet and the second ferromagnet, it becomes feasible to provide the direction of magnetization of at least one of the first ferromagnet and the second ferromagnet with unidirectional anisotropy. In this case, the first ferromagnet or the second ferromagnet is obtained with a higher coercive force in one direction than in the case without the antiferromagnet. When the magnetization is fixed by the shape anisotropy, it becomes feasible to omit the antiferromagnet for providing the coercive force difference.

Preferably, a coercive force of the first ferromagnet is different from a coercive force of the second ferromagnet. This configuration allows one of the first ferromagnet and the second ferromagnet to function as a magnetization fixed layer and the other as a magnetization free layer, whereby the spin transport element can be suitably used as a magnetic sensor or the like.

The present invention successfully provides the spin transport element capable of suppressing the noise or error due to the external magnetic field to enter the channel.

DESCRIPTION OF THE PREFERRED EMBODIMENTS

Figure 1:
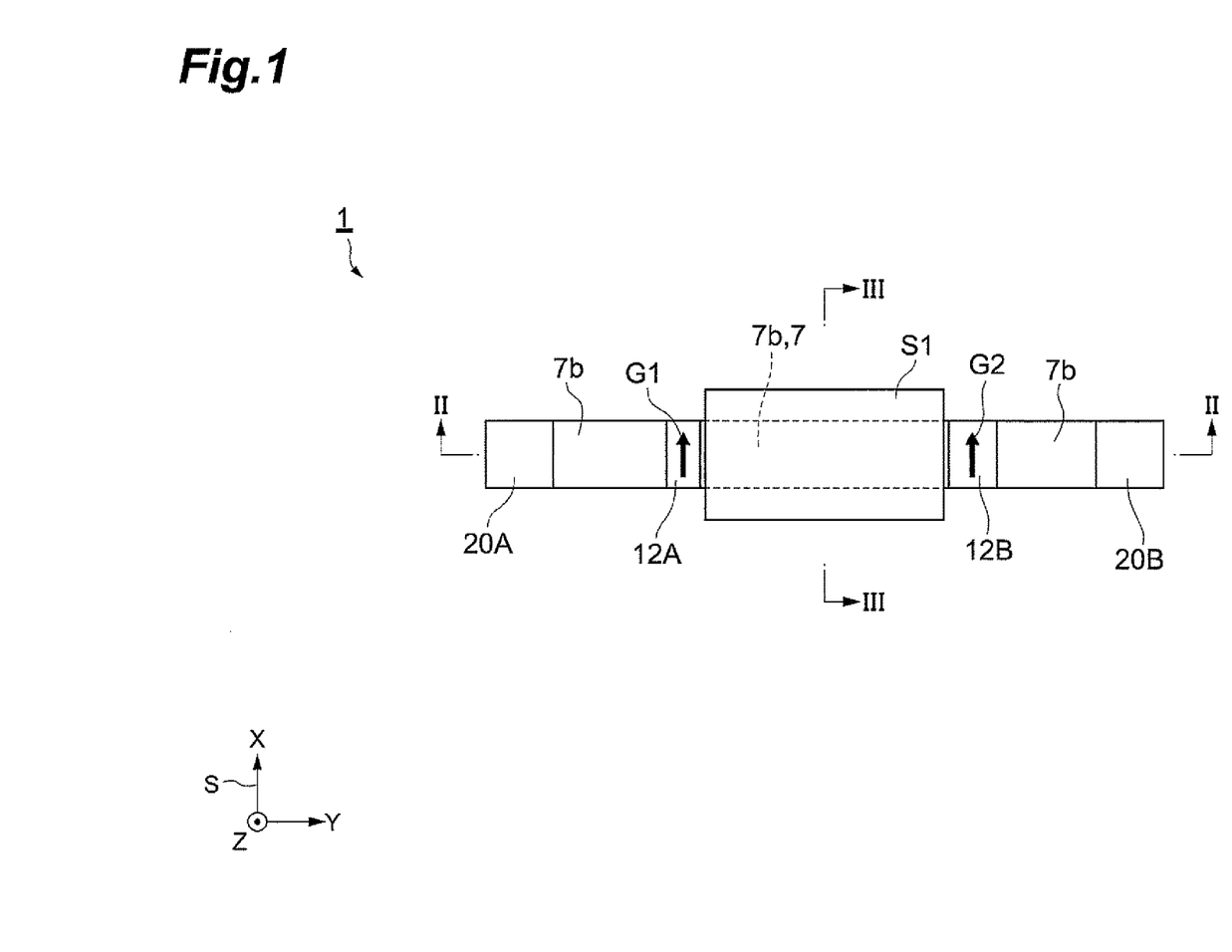
FIG. 1 is a top plan view of a spin transport element.
Figure 2:
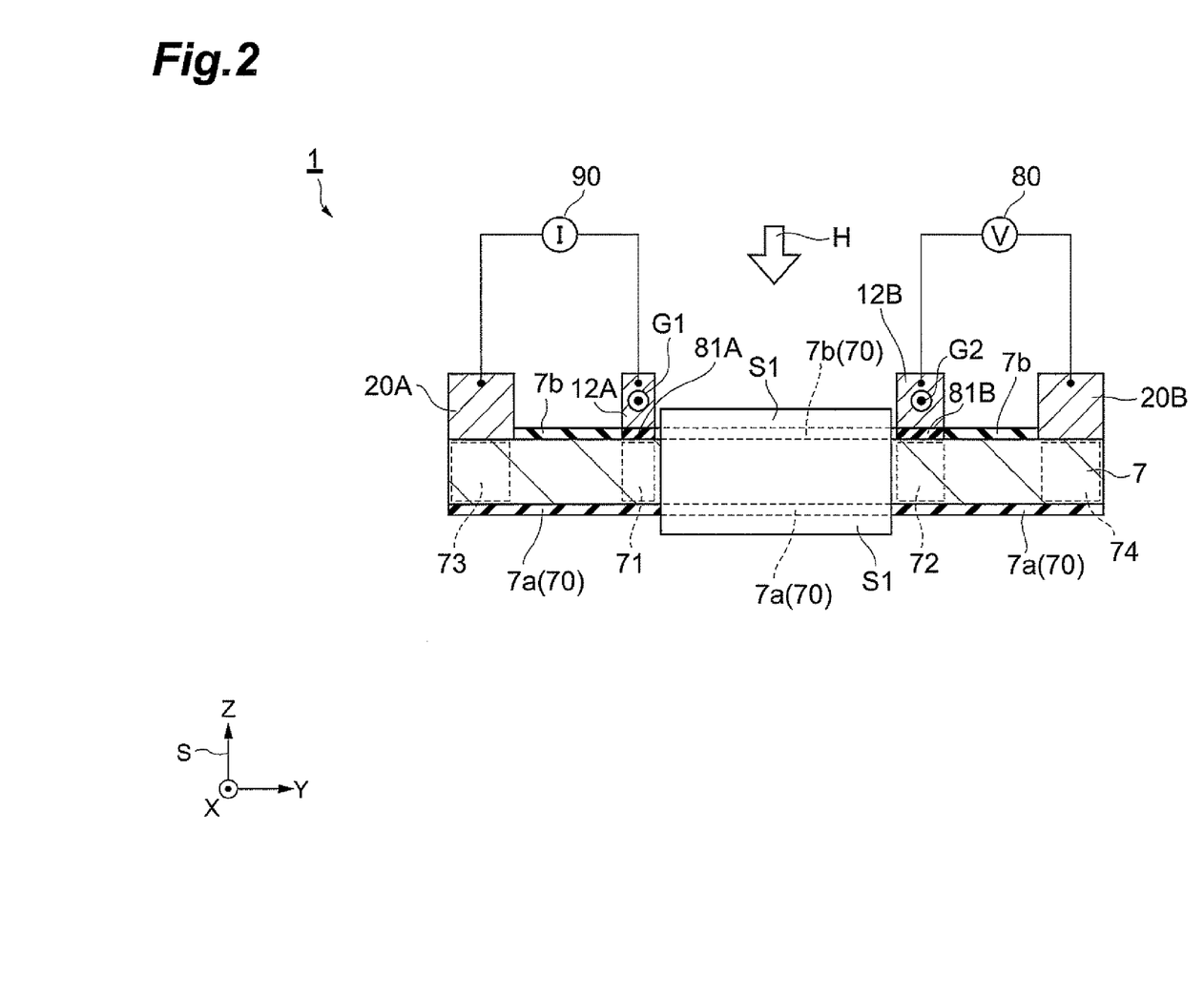
FIG. 2 is a cross-sectional view along the line II-II in FIG. 1.
Figure 3:
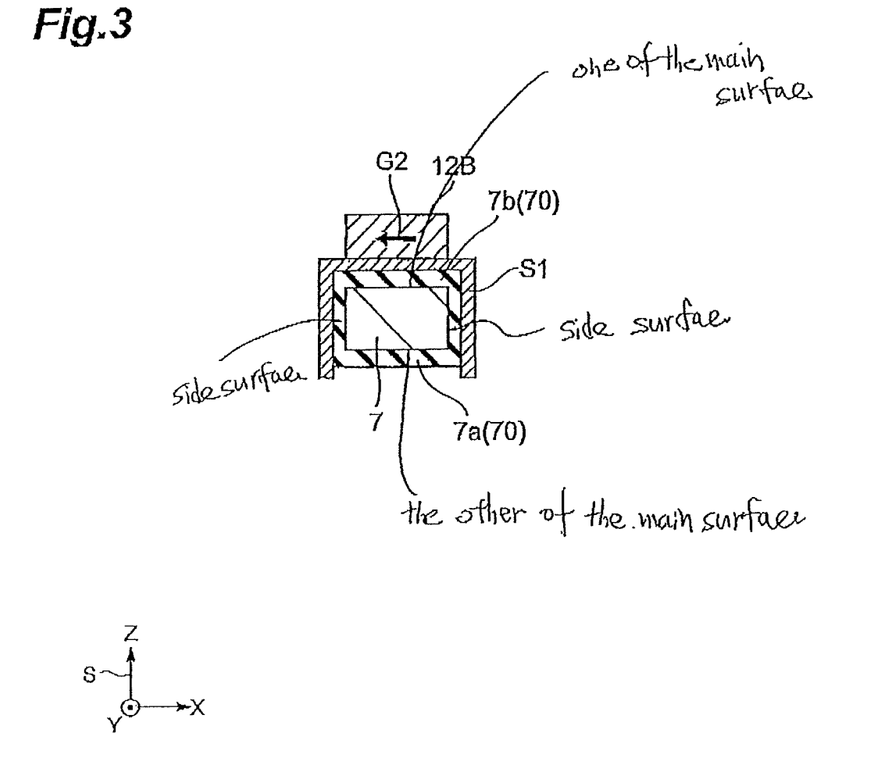
FIG. 3 is a cross-sectional view along the line III-III in FIG. 1.

The preferred embodiments of the spin transport element according to the present invention will be described below in detail with reference to the drawings. In the drawings, an XYZ orthogonal coordinate axis system S is shown. FIG. 1 is a top plan view of a spin transport element according to the first embodiment. FIG. 2 is a cross-sectional view along the line II-II in FIG. 1. FIG. 3 is a cross-sectional view along the line III-III in FIG. 1.

As shown in FIG. 2, the spin transport element 1 mainly has a channel layer 7, a first ferromagnetic layer 12A, a second ferromagnetic layer 12B, an insulating film 70, and a magnetic shield S1. The channel layer 7 is a portion which diffuses and accumulates spins, and extends from the first ferromagnetic layer 12A to the second ferromagnetic layer 12B. As shown in FIG. 1, the channel layer 7 is of a rectangular shape when viewed from the thickness direction of the channel layer 7. The channel layer 7 is doped with ions for providing electric conductivity, e.g., P ions or Sb ions. An ion concentration is, for example, from $1.0 \times 10^{15}$ to $1.0 \times 10^{22}$ $cm^{-3}$. A material of the channel layer 7 is, for example, Si. The distance from the first ferromagnetic layer 12A to the second ferromagnetic layer 12B in the channel layer 7 is not more than the spin diffusion length of the channel layer 7.

The first ferromagnetic layer 12A and the second ferromagnetic layer 12B are portions that function as an injecting electrode for injecting spins into the channel layer 7, or as a receiving electrode for detecting spins transported through the channel layer 7. The first ferromagnetic layer 12A is provided on a first region 71 of the channel layer 7. The second ferromagnetic layer 12B is provided on a second region 72 of the channel layer 7.

The first ferromagnetic layer 12A and the second ferromagnetic layer 12B each have a rectangular parallelepiped shape with the major axis along the X-axis direction and the minor axis along the Y-axis direction. The coercive force of the first ferromagnetic layer 12A is different from that of the second ferromagnetic layer 12B. In the present embodiment, the width in the X-axis direction of the first ferromagnetic layer 12A is equal to the width in the X-axis direction of the second ferromagnetic layer 12B, while the width in the Y-axis direction of the first ferromagnetic layer 12A is smaller than the width in the Y-axis direction of the second ferromagnetic layer 12B. Because of this shape anisotropy, the coercive force of the first ferromagnetic layer 12A is larger than that of the second ferromagnetic layer 12B. As shown in FIGS. 1 and 2, the magnetization direction G1 of the first ferromagnetic layer 12A is parallel, namely identical to the magnetization direction G2 of the second ferromagnetic layer 12B.

The first ferromagnetic layer 12A and the second ferromagnetic layer 12B are composed of a ferromagnetic material, e.g., any one of the following materials (1) to (3): (1) a metal selected from the group consisting of Cr, Mn, Co, Fe, and Ni; (2) an alloy containing one or more elements selected from the group consisting of Cr, Mn, Co, Fe, and Ni; (3) a compound containing one or more elements selected from the group consisting of Cr, Mn, Co, Fe, and Ni, and one or more elements selected from the group consisting of B, C, and N.

The magnetic shield S1 is a film that blocks an external magnetic field from entering the channel layer 7. For this reason, the magnetic shield S1 covers at least a part of the surface of the channel layer 7 with the insulating film (e.g., insulating film 7a, 7b) in between. Namely, the magnetic shield S1 covers at least one surface out of the top face, side faces, and bottom face in a region of the channel layer 7 existing between the first region 71 and the second region 72. The magnetic shield S1 is formed through the insulating film 70 or an air layer or the like so as to avoid direct contact with the channel layer 7, the first ferromagnetic layer 12A, and the second ferromagnetic layer 12B.

The magnetic shield S1 preferably covers a surface of the channel layer 7 parallel to the direction G1 of magnetization of the first ferromagnetic layer 12A and the direction G2 of magnetization of the second ferromagnetic layer 12B (XY surfaces in the example shown in FIGS. 1 and 2), and this configuration allows spins under transport in the channel layer 7 to be efficiently prevented from rotating because of the external magnetic field.

A material of the magnetic shield S1 is, for example, a soft magnetic material containing one or more elements selected from the group consisting of Ni, Fe, and Co, specifically, a soft magnetic material such as an alloy containing Ni and Fe, a sendust, an alloy containing Fe and Co, or an alloy containing Fe, Co, and Ni. The thickness of the magnetic shield S1 is, for example, from 10 nm to 100 nm.

The spin transport element 1 further has a first reference electrode 20A and a second reference electrode 20B. The first reference electrode 20A and the second reference electrode 20B are provided on a third region 73 and on a fourth region 74, respectively, of the channel layer 7. The first reference electrode 20A and the second reference electrode 20B are composed of an electroconductive material, e.g., a nonmagnetic metal with low resistance to Si, such as Al.

The distance between the first reference electrode 20A and the first ferromagnetic layer 12A is longer than the spin diffusion length in which electrons in the channel layer 7 can retain their spins. The distance between the second reference electrode 20B and the second ferromagnetic layer 12B is longer than the spin diffusion length in the channel layer 7. This configuration can prevent spins from being absorbed by the first reference electrode 20A and the second reference electrode 20B to lower an output. For example, in the case where the channel layer 7 is Si, the spin diffusion length is approximately 2.5 μm.

As shown in FIG. 2, the first region 71 and the second region 72 exist between the third region 73 and the fourth region 74 in the channel layer 7. The first reference electrode 20A, first ferromagnetic layer 12A, second ferromagnetic layer 12B, and second reference electrode 20B are arranged in this order at predetermined intervals in the X-axis direction on these third region 73, first region 71, second region 72, and fourth region 74 of the channel layer 7. The channel layer 7 extends from the first ferromagnetic layer 12A to the first reference electrode 20A in a direction different from the extending direction from the first ferromagnetic layer 12A to the second ferromagnetic layer 12B, and the channel layer 7 extends from the second ferromagnetic layer 12B to the second reference electrode 20B in a direction different from the extending direction from the second ferromagnetic layer 12B to the first ferromagnetic layer 12A.

The spin transport element 1 further has barrier layers 81A, 81B. The barrier layers 81A, 81B are provided between the channel layer 7 and, at least one of the first ferromagnetic layer 12A and the second ferromagnetic layer 12B. This enables many spin-polarized electrons to be injected from at least one of the first ferromagnetic layer 12A and the second ferromagnetic layer 12B into the channel layer 7, thereby increasing a potential output of the spin transport element. The barrier layers 81A, 81B are, for example, tunnel barriers composed of a film of an electrical insulating material. FIG. 2 shows an example in which the barrier layers 81A, 81B are comprised of single layers, but the barrier layers 81A, 81B may have a multilayer structure consisting of a plurality of layers. This configuration can prevent the magnetic material of the first ferromagnetic layer 12A and the second ferromagnetic layer 12B from diffusing into the channel layer 7. Furthermore, it can control scattering and accumulation of spins at the interface between the barrier layers 81A, 81B and the channel layer 7.

A material of the barrier layers 81A, 81B is an oxide material containing at least one of Mg and Al. These materials can suitably improve the injection efficiency of spins to be injected from at least one of the first ferromagnetic layer 12A and the second ferromagnetic layer 12B into the channel. Specific materials applicable to the bather layers 81A, 81B are, for example, MgO, $Al_2O_3$, $MgAl_2O_4$, and so on. From the viewpoints of suppressing increase in resistance and making them function as tunnel insulating layers, the thickness of the barrier layers 81A, 81B is preferably not more than 3 nm. The thickness of the barrier layers 81A, 81B is preferably not less than 0.4 nm in view of the thickness of a monatomic layer.

The spin transport element 1 further has the insulating film (or insulator) 70. The insulating film 70 has functions to prevent exposure of the channel layer 7 and to electrically and magnetically isolate the channel layer 7. Since the insulating film 70 is provided between the magnetic shield S1 and the channel layer 7, a spin current flowing in the channel layer 7 is prevented from flowing out to the magnetic shield S1. The insulating film 70 includes a lower insulating film 7a and an upper insulating film 7b. As shown in FIG. 2, the lower insulating film 7a is provided on the bottom face of the channel layer 7 and the upper insulating film 7b on the top face of the channel layer 7. As shown in FIG. 3, the outer surface of the insulating film 70 is in contact with the magnetic shield S1 and the inner surface of the insulating film 70 is in contact with the channel layer 7. In this manner the insulating film 70 covers necessary regions of the surface (e.g., the bottom face, side faces, or top face) of the channel layer 7. Furthermore, when wires to be connected to the first reference electrode 20A, the first ferromagnetic layer 12A, the second ferromagnetic layer 12B, and the second reference electrode 20B are provided on this upper insulating film 7b, spins in the channel layer 7 are prevented from being absorbed by the wires. When the wires are provided on the upper insulating film 7b, it is feasible to prevent an electric current from flowing from the wires to the channel layer 7.

The operation of the spin transport element 1 will be described below using FIG. 2. First, the magnetization directions of the first ferromagnetic layer 12A and the second ferromagnetic layer 12B are fixed. In the example shown in FIG. 2, the magnetization direction G1 of the first ferromagnetic layer 12A is the same (X-axis direction) as the magnetization direction G2 of the second ferromagnetic layer 12B. The first ferromagnetic layer 12A and the first reference electrode 20A are connected to a current source 90, whereby an electric current for detection flows to the first ferromagnetic layer 12A. When the electric current flows from the first ferromagnetic layer 12A of the ferromagnet through the barrier layer 81A into the channel layer 7 of the nonmagnetic material, electrons with spins in a direction corresponding to the direction G1 of magnetization of the first ferromagnetic layer 12A are injected into the channel layer 7. The injected spins diffuse toward the second ferromagnetic layer 12B. In this manner, the element can be formed in the structure in which the electric current and spin current flowing into the channel layer 7 flow mainly in the Y-axis direction. In this configuration, a magnetic field is applied in an opposite direction (e.g., the −X-axis direction shown in FIG. 2) to the magnetization direction of the first ferromagnetic layer 12A and the second ferromagnetic layer 12B. On this occasion, with increasing in strength of the magnetic field, the magnetization in the second ferromagnetic layer 12B with the smaller coercive force is inverted. With further increasing in strength of the magnetic field, the magnetization in the second ferromagnetic layer 12B with the smaller coercive force is further inverted. An output with this magnetization inversion can be measured with an output measuring device 80 connected to the second ferromagnetic layer 12B and the second reference electrode 20B. As described above, the spin transport element 1 can be used, for example, as a magnetic sensor.

Figure 4:
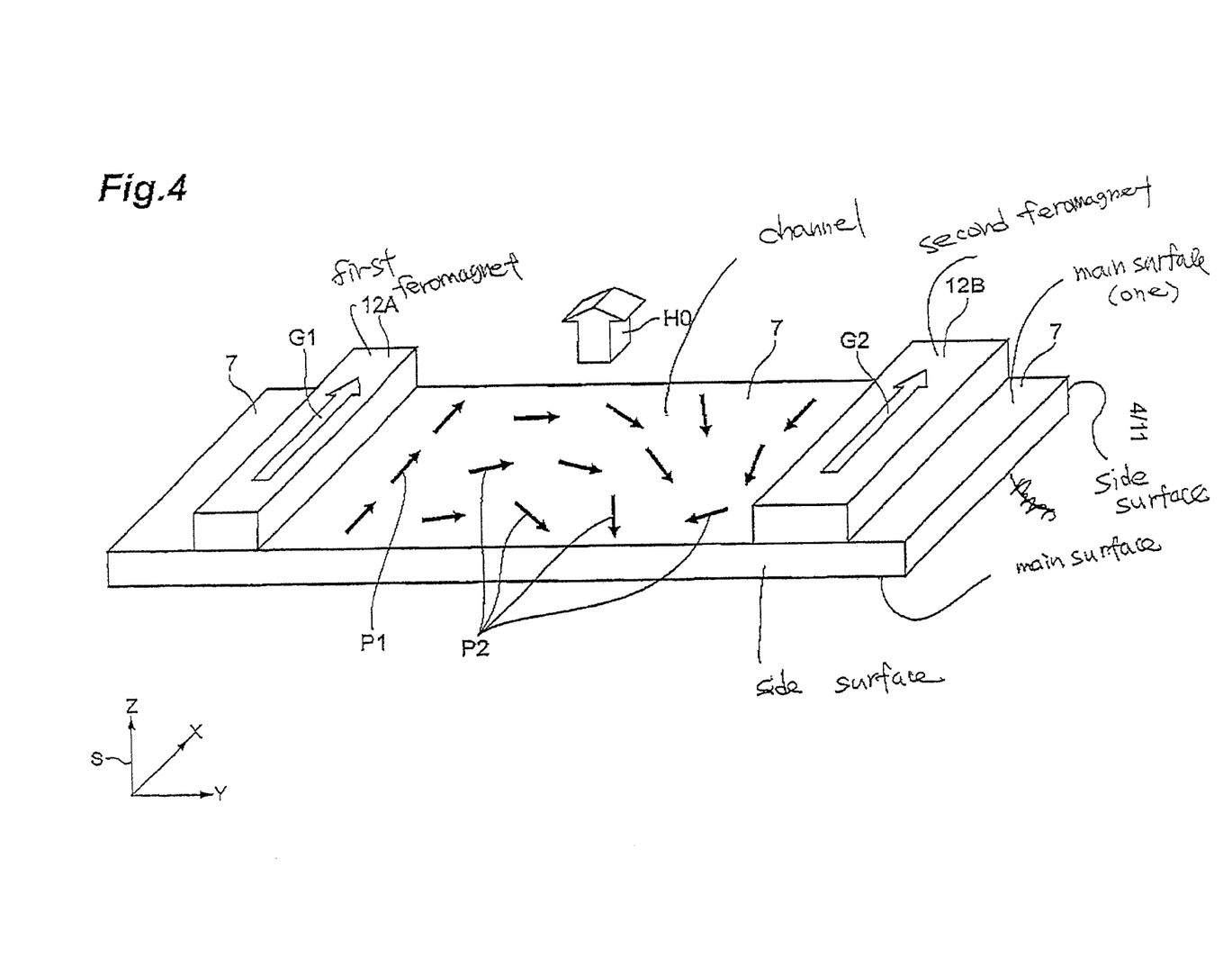
FIG. 4 is a perspective view for explaining the Hanle effect.
Figure 5:
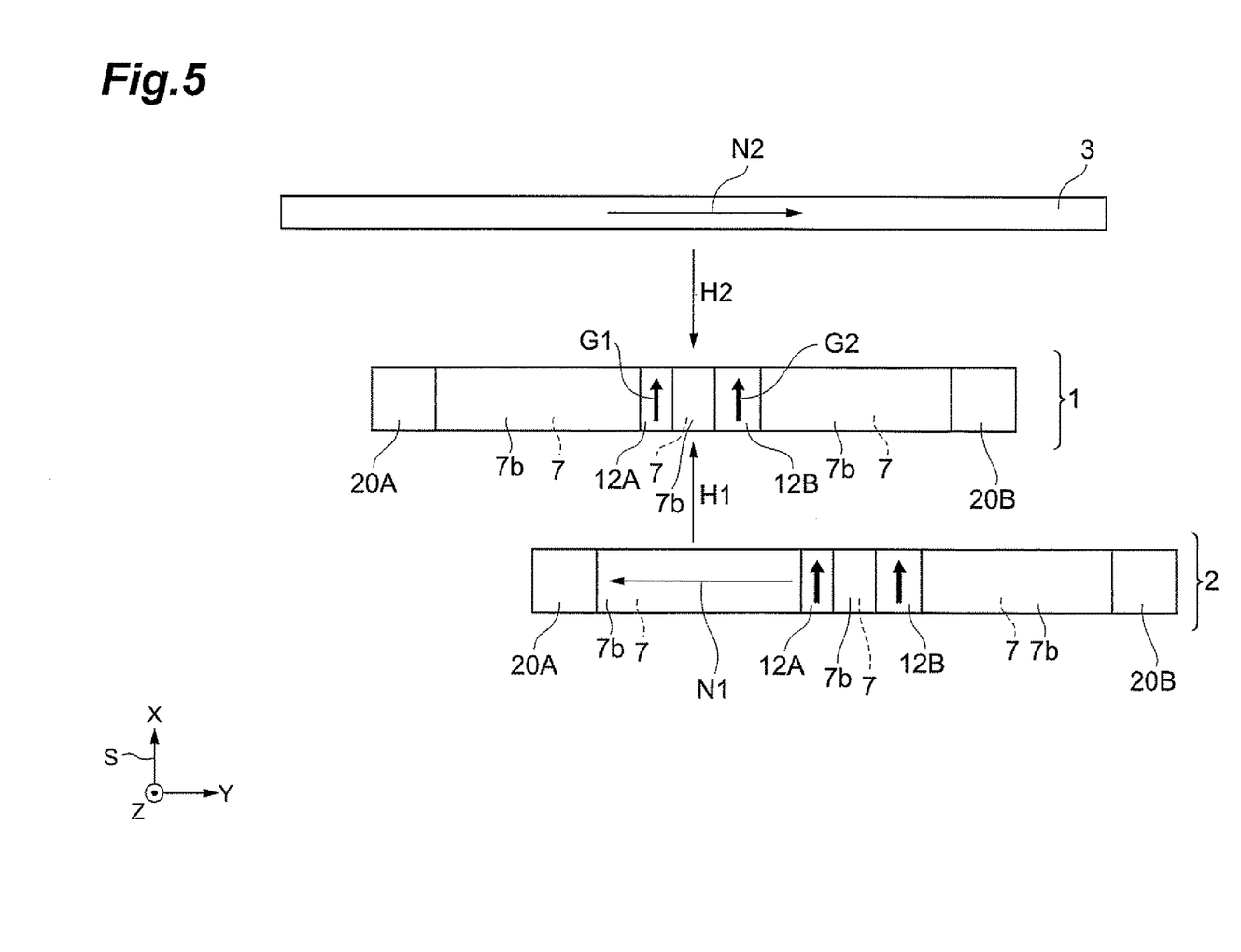
FIG. 5 is a top plan view showing examples in which a magnetic field enters a spin transport element because of an electric current flowing in the vicinity of the spin transport element.

As a supplement, the below will describe a situation in which an external magnetic field enters the channel layer 7 of the spin transport element. As described above, when an electric current flows from the first ferromagnetic layer 12A of the ferromagnet into the channel layer 7 of the nonmagnetic material, electrons with spins P1 in a direction corresponding to the direction G1 of magnetization of the first ferromagnetic layer 12A as shown in FIG. 4 are injected into the channel layer 7. If an external magnetic field H0 enters the channel layer 7 (from the Z-axis direction in this example), the spins of the electrons in the channel layer 7 will rotate because of influence of this external magnetic field H0. Therefore, in the channel layer 7, electrons with spins P2 in directions different from the direction G1 of magnetization of the first ferromagnetic layer 12A will be transported toward the second ferromagnetic layer 12B. FIG. 5 shows examples of generation of such an external magnetic field. In a first situation where another spin transport element 2 is located near the spin transport element 1, an electric current N1 flows in the spin transport element 2, whereupon an external magnetic field H1 enters the channel layer 7 of the spin transport element 1. In another situation where an electroconductive layer 3 is arranged near the spin transport element 1, an electric current N2 flows in the electroconductive layer 3, whereupon an external magnetic field H2 enters the channel layer 7. In this manner, the magnetic field is established by the electric current flowing in a surrounding circuit and then the spin current under transport in the channel layer 7 rotates because of influence of this external magnetic field.

The below will describe the effect of the spin transport element 1 according to the present embodiment. One of the aforementioned first ferromagnetic layer 12A and second ferromagnetic layer 12B functions as an injecting electrode for injecting spins into the channel layer 7, while the other functions as a receiving electrode for receiving spins from the channel layer 7. The channel layer 7 functions as a portion in which spins injected from the first ferromagnetic layer 12A or the second ferromagnetic layer 12B are transported. The spins under transport in the channel layer 7 retain magnetization information of one of the first ferromagnetic layer 12A or the second ferromagnetic layer 12B. In the spin transport element 1 of the present embodiment, the channel layer 7 is covered through the insulating film 70 by the magnetic shield S1. For this reason, in the situations where the external magnetic field enters the channel layer 7, the magnetic shield can prevent the spins under transport in the channel layer 7 from rotating because of influence of the external magnetic field. Therefore, the magnetization information retained by the spins under transport in the channel layer 7 is accurately transmitted, while suppressing the noise or error due to the entrance of the external magnetic field into the channel. The spin transport element 1 of this configuration can be applied, for example, to magnetic sensors, magnetoresistive random access memories (MRAMs), spin current circuits, nuclear spin memories, quantum computers, and so on.

Figure 6:
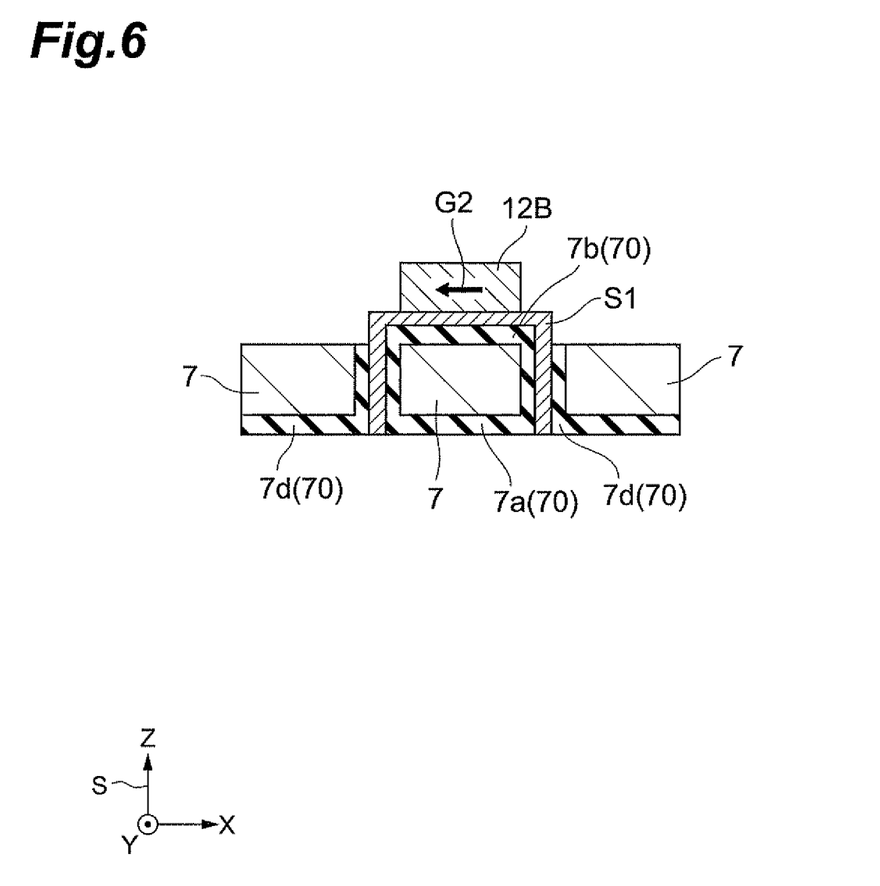
FIG. 6 is a cross-sectional view showing a modification example of FIG. 3.

The above detailed the preferred embodiment of the present invention, but it should be noted that the present invention is by no means limited to the above embodiment. The below will describe modification examples, and in each of these modification examples, as in the case of the above embodiment, it is also feasible to suppress the noise or error due to the entrance of the external magnetic field into the channel. First, FIG. 6 shows a modification example of FIG. 3. The cross-sectional structure shown in FIG. 6 is different from that shown in FIG. 3, in that the insulating film 70 and the magnetic shield S1 are buried in part in the channel layer 7. Namely, the element may be configured in a structure in which the insulating film 70 (7a, 7b), magnetic shield S1, and insulating film 70 (7d) are buried in order from inside to outside in a groove formed so as to surround the spin transported region, in the region between the first region 71 and the second region 72 in the channel layer 7.

Figure 7:
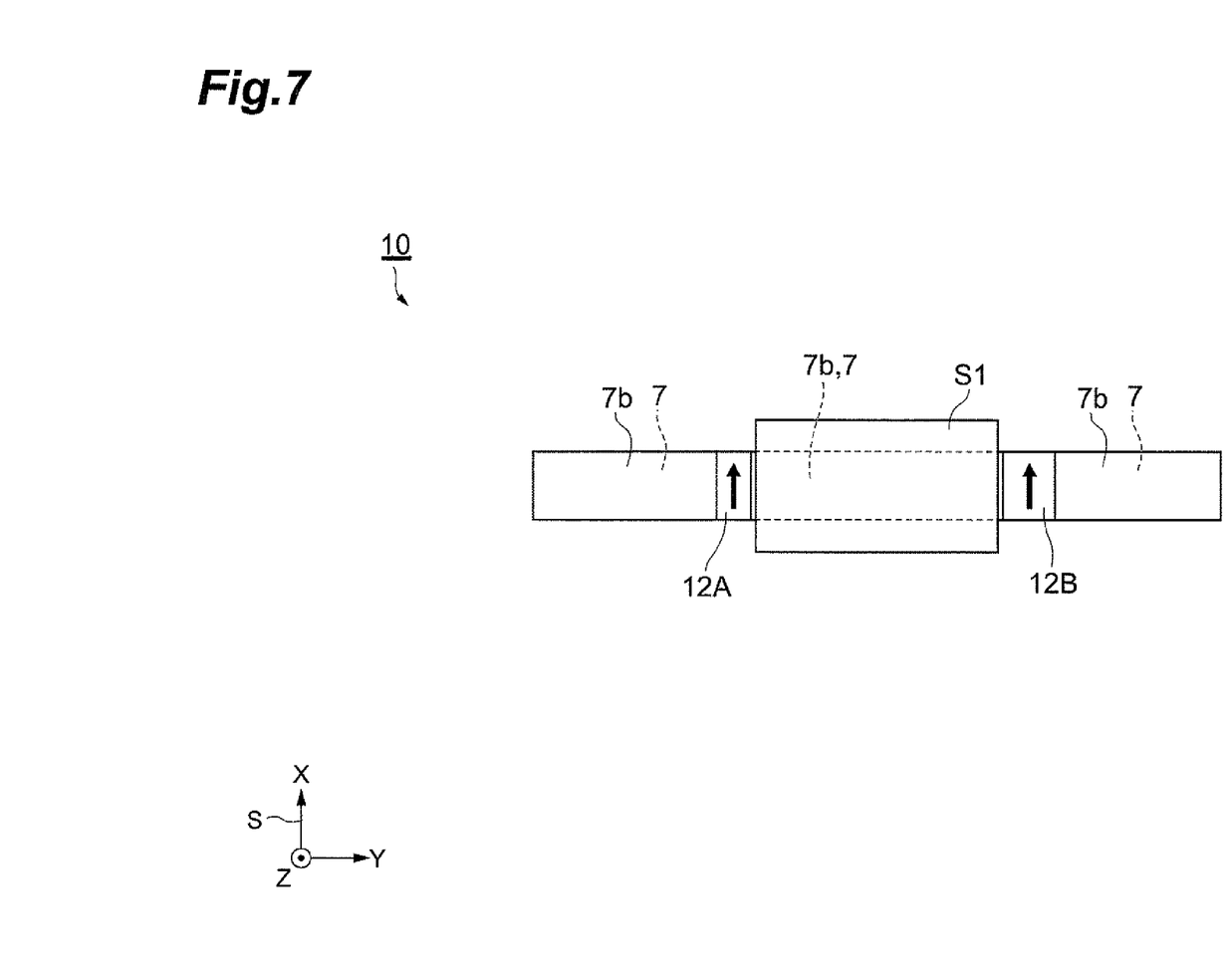
FIG. 7 is a top plan view showing a modification example of the spin transport element.

The first reference electrode 20A and the second reference electrode 20B are not always essential and thus may be omitted. FIG. 7 shows a top plan view of a spin transport element 10 of such a configuration, as a modification example. In this case, a current source is connected to the first ferromagnetic layer 12A and the second ferromagnetic layer 12B to flow an electric current, whereby spins can be injected into the channel layer 7.

Materials with a long spin lifetime applicable to the channel layer 7 are, for example, Si, GaAs, and so on, and, particularly, Si is preferably applicable. However, the material of the channel layer 7 is not limited to Si, and a material with a long spin lifetime is preferably used; for example, the material of the channel can be a material containing one or more semiconductors selected from the group consisting of Si, Ge, GaAs, C, and ZnO.

Furthermore, the shape of the channel layer 7, when viewed from the thickness direction thereof, is not limited to the rectangular shape, but may be, for example, a curved shape. Furthermore, the above showed the example in which the first ferromagnetic layer 12A and the second ferromagnetic layer 12B were formed in a projecting state through the barrier layers 81A, 81B while the first reference electrode 20A and the second reference electrode 20B were also projecting, on the top face of the channel layer 7, but at least one of the first ferromagnetic layer 12A, the second ferromagnetic layer 12B, the first reference electrode 20A, and the second reference electrode 20B may be buried in the channel layer 7.

The above showed the example wherein the barrier layers 81A, 81B were tunnel barriers comprised of the insulating film. However, the barrier layers 81A, 81B may be tunnel barriers comprised of a metal film and in this case, they can be Schottky barriers consisting of the channel layer 7 of the semiconductor and the barrier layers 81A, 81B of the metal.

The above showed the example wherein the first ferromagnetic layer 12A and the second ferromagnetic layer 12B had the different coercive forces by virtue of the shape anisotropy, but the present invention is not limited to this example. For example, it is also possible to employ a configuration wherein the first ferromagnetic layer 12A and the second ferromagnetic layer 12B have the same shape and thus have the same coercive force by shape anisotropy, in which the magnetization direction of at least one of the first ferromagnetic layer 12A and the second ferromagnetic layer 12B is fixed by an antiferromagnetic layer (antiferromagnet) provided on at least one of the first ferromagnetic layer 12A and the second ferromagnetic layer 12B. In this case, the first ferromagnetic layer 12A or the second ferromagnetic layer 12B is obtained with a higher coercive force in one direction than in the case without the antiferromagnetic layer (antiferromagnet). It is also possible to adopt another configuration wherein the first ferromagnetic layer 12A and the second ferromagnetic layer 12B have shape anisotropy and thus have different coercive forces and wherein an antiferromagnetic layer (antiferromagnet) is further used.

Furthermore, the arrangement of the current source 90 and the output measuring device 80 may be switched and in this case, the first ferromagnetic layer 12A functions as a receiving electrode while the second ferromagnetic layer 12B as an injecting electrode.

The above description was given using the example wherein the channel layer 7, first ferromagnetic layer 12A, second ferromagnetic layer 12B, and magnetic shield S1 were so-called "layers," but the present invention is not limited to this example. Each of the channel layer 7, first ferromagnetic layer 12A, second ferromagnetic layer 12B, and magnetic shield S1 can be selected from various forms of channels, first ferromagnets, second ferromagnets, and magnetic shields as long as it can be used as a constituent material of the foregoing spin transport element. In this case, each of the channel, first ferromagnet, second ferromagnet, and magnetic shield can be formed, for example, in a spherical shape, a cylindrical shape, or the like.

The below will describe Examples and Comparative Examples and it should be noted that the present invention is by no means limited to the examples below.

Example 1

First, a Si substrate was prepared. Then it was cleaned to remove impurities, oxides, organic matter, etc. from on the surface of the Si substrate. A cleaning solution used was a diluted HF solution. Thereafter, ions for providing electric conductivity were injected into the surface of the Si substrate. It was carried out so that an electron concentration became $1 \times 18^{18}$ cm$^{-3}$.

Subsequently, a barrier film to become the barrier layers 81A, 81B was deposited on the surface of the Si substrate by the MBE process. Thereafter, a mask of a nearly rectangular shape was formed on a portion to become the channel layer 7, and the Si substrate was subjected to reactive ion etching (RIE), thereby obtaining the channel layer 7 in an island shape. After the etching, the unnecessary mask was removed.

Next, a ferromagnetic film to become the ferromagnetic layers was formed through a barrier film on the channel layer 7 by electron beam (EB) lithography. Unnecessary portions of the ferromagnetic film and barrier film were removed by ion milling to form the first ferromagnetic layer 12A through the barrier layer 81A on the first region of the channel layer 7 and the second ferromagnetic layer 12B through the barrier layer 81B on the second region of the channel layer 7. In this example, the coercive force of the first ferromagnetic layer 12A was made greater than that of the second ferromagnetic layer 12B.

Next, a silicon oxide film to become the insulating film was formed on the surface of the channel layer 7 after removal of the unnecessary barrier film and ferromagnetic film. Furthermore, the insulating film was removed from on the third region 73 and the fourth region 74 of the channel layer 7 and then the first reference electrode 20A and the second reference electrode 20B were formed on the respective removed portions. The first reference electrode 20A and the second reference electrode 20B were made of an Al film with low resistance to the Si film of the channel layer 7.

The magnetic shield S1 was formed through the insulating film on the surface of the region existing between the first region 71 and the second region 72 in the channel layer 7, by the IBD (ion beam deposition) process. On this occasion, the magnetic shield S1 was formed without direct contact thereof with the channel layer 7, first ferromagnetic layer 12A, and second ferromagnetic layer 12B. Furthermore, respective wires were formed to the first ferromagnetic layer 12A, the second ferromagnetic layer 12B, the first reference electrode 20A, and the second reference electrode 20B. On this occasion, an insulating film was formed between each wire and the magnetic shield S1 so as to prevent each wire from directly contacting the magnetic shield S1. The spin transport element 1 as shown in FIGS. 1 to 3 was produced by the above-described method.

Example 2

In Example 2, a spin transport element 10 as shown in FIG. 7 was produced in the same configuration as the spin transport element 1 of Example 1 except that the first reference electrode 20A and the second reference electrode 20B thereof were excluded.

Comparative Example 1

In Comparative Example 1, a spin transport element was produced in the same configuration as the spin transport element 1 of Example 1 except that a metal layer of Al covering the channel layer was provided instead of the magnetic shield S1 of the element 1.

Comparative Example 2

In Comparative Example 2, a spin transport element was produced in the same configuration as the spin transport element 10 of Example 2 except that the magnetic shield S1 thereof was excluded.
(Evaluation Results)

Figure 11:
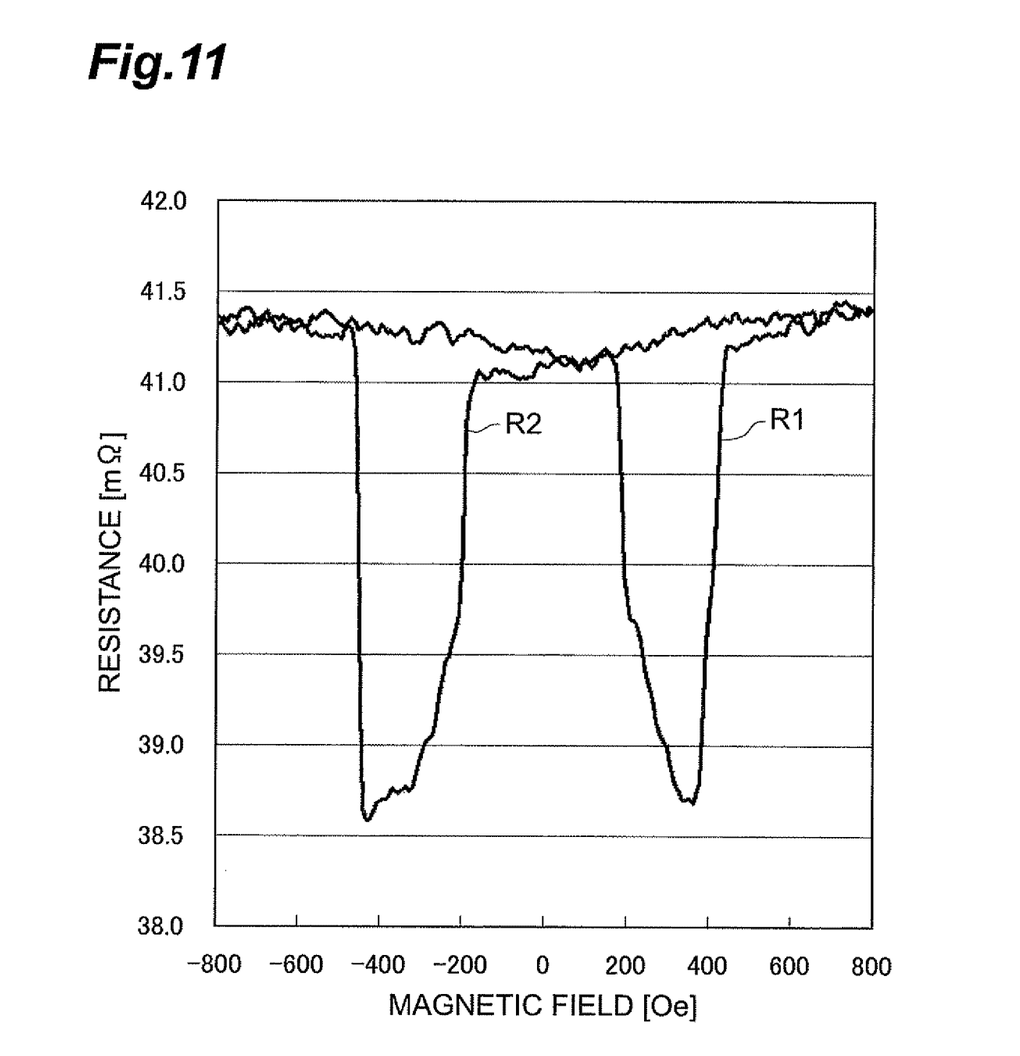
FIG. 11 is a graph showing relations of magnetic field in the X-direction and resistance.

In the spin transport elements 1 produced in Example 1 and Comparative Example 1, the current source was connected to the first ferromagnetic layer 12A and the first reference electrode 20A and the output measuring device was connected to the second ferromagnetic layer 12B and the second reference electrode 20B. The magnetization directions of the first ferromagnetic layer 12A and the second ferromagnetic layer 12B were fixed in the same direction (the X-axis direction shown in FIGS. 1 and 2.). In this configuration, first, a magnetic field was applied in the opposite direction (the −X-axis direction shown in FIGS. 1 and 2) to the magnetization directions of the first ferromagnetic layer 12A and the second ferromagnetic layer 12B. It was then confirmed that a hysteresis output due to the difference between the strengths of the magnetic field necessary for inversion of magnetization of the first ferromagnetic layer 12A and the second ferromagnetic layer 12B was obtained between the first ferromagnetic layer 12A and the second ferromagnetic layer 12B, by repeating the steps of varying the strength of the magnetic field in the X-axis direction from +800 (Oe) to −800 (Oe) as indicated by R1 in FIG. 11 and thereafter varying the strength of the magnetic field in the X-axis direction from −800 (Oe) to +800 (Oe) as indicated by R2 in FIG. 11.

Thereafter, a magnetic field parallel to the magnetization directions of the first ferromagnetic layer 12A and the second ferromagnetic layer 12B and stronger than the inverting magnetic field was applied to again align the magnetization directions of the first ferromagnetic layer 12A and the second ferromagnetic layer 12B (to the X-axis direction shown in FIGS. 1 and 2). Subsequently, an external magnetic field H was applied to the channel layer 7 from the thickness direction of the channel layer 7 (the −Z-axis direction shown in FIGS. 1 and 2). On this occasion, the strength of the external magnetic field H from the Z-axis direction was varied from +1.0 (Oe) to −1.0 (Oe) to observe change in resistance output obtained between the first ferromagnetic layer 12A and the second ferromagnetic layer 12B. On this occasion, no bias voltage was applied to the magnetic shield S1.

Figure 8:
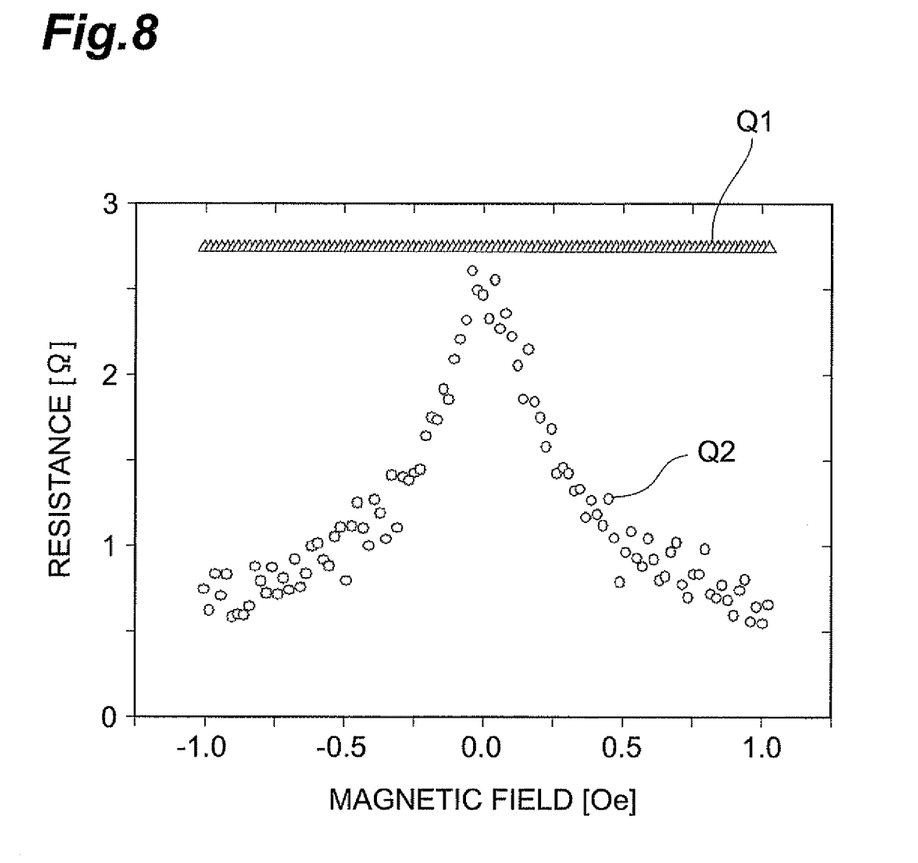
FIG. 8 is a graph showing relations of magnetic field and resistance with no bias voltage being applied in Example 1 and Comparative Example 1.

FIG. 8 shows measured relations of magnetic field and resistance. The horizontal axis in FIG. 8 corresponds to the external magnetic field H from the −Z-axis direction applied to the channel layer 7, and the resistance on the vertical axis was measured by the aforementioned output measuring device. Q1 in FIG. 8 corresponds to the measurement result of the spin transport element 1 of Example 1, and Q2 corresponds to the measurement result of the spin transport element of Comparative Example 1. It is seen that since the spin transport element 1 of Example 1 is provided with the magnetic shield S1, there is little increase or decrease in resistance due to the external magnetic field H applied to the channel layer, when compared with the spin transport element of Comparative Example 1 without the magnetic shield. Since the spin transport element 1 of Example 1 in this configuration is provided with the magnetic shield S1 covering the channel layer 7, the noise or error due to the external magnetic field H entering the channel layer 7 is suppressed.

Figure 9:
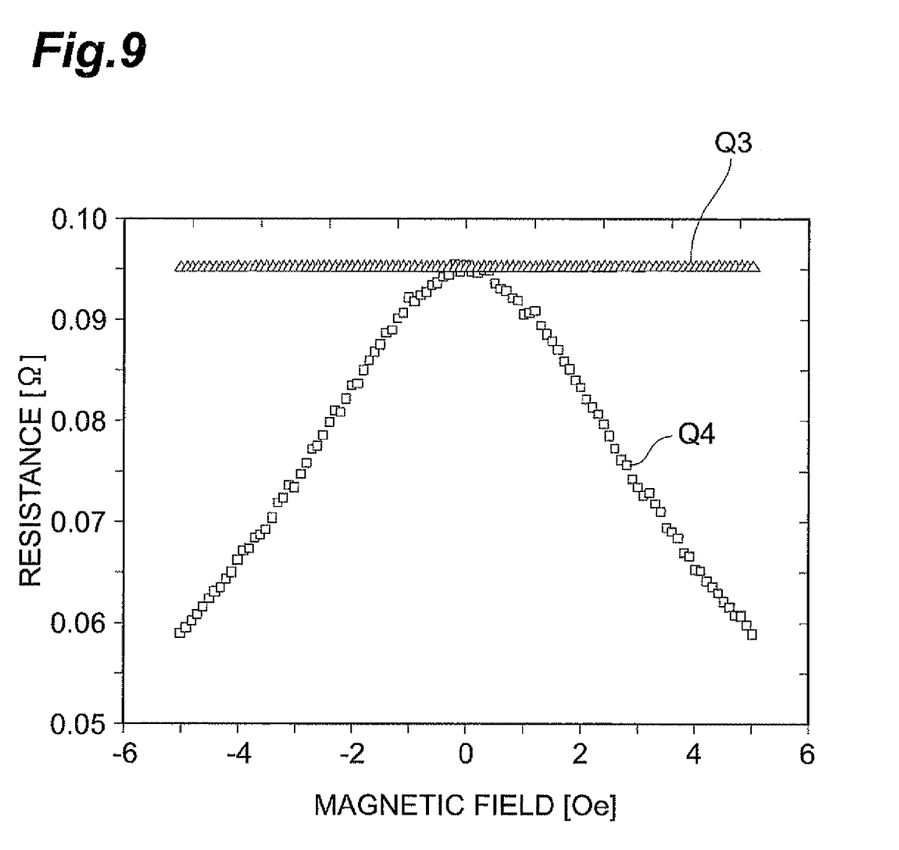
FIG. 9 is a graph showing relations of magnetic field and resistance with a bias voltage being applied in Example 1 and Comparative Example 1.

FIG. 9 shows measured relations of magnetic field and resistance in cases where in the spin transport element 1 of Example 1 the bias of 50 V was further applied to the magnetic shield S1 and where in the spin transport element of Comparative Example 1 the bias voltage of 50 V was further applied to the metal layer covering the channel layer. On this occasion, variation in resistance output obtained between the first ferromagnetic layer 12A and the second ferromagnetic layer 12B was observed with change in the strength of the external magnetic field H in the Z-axis direction from +5.0 (Oe) to −5.0 (Oe). The horizontal axis in FIG. 9 corresponds to the external magnetic field H from the −Z-axis direction applied to the channel layer 7, and the resistance on the vertical axis was measured by the aforementioned output measuring device. Q3 in FIG. 9 corresponds to the measurement result of the spin transport element 1 of Example 1 and Q4 corresponds to the measurement result of the spin transport element of Comparative Example 1. It is also seen in this case that since the spin transport element 1 of Example 1 is provided with the magnetic shield S1, there is little increase or decrease in resistance due to the external magnetic field H applied to the channel layer, when compared with the spin transport element of Comparative Example 1 without the magnetic shield. Furthermore, it is seen from a comparison between FIG. 8 and FIG. 9 that the resistance is lower in the case where the bias voltage is 50 V as in FIG. 9 than in the case where the bias voltage is 0 V as shown in FIG. 8.

Figure 10:
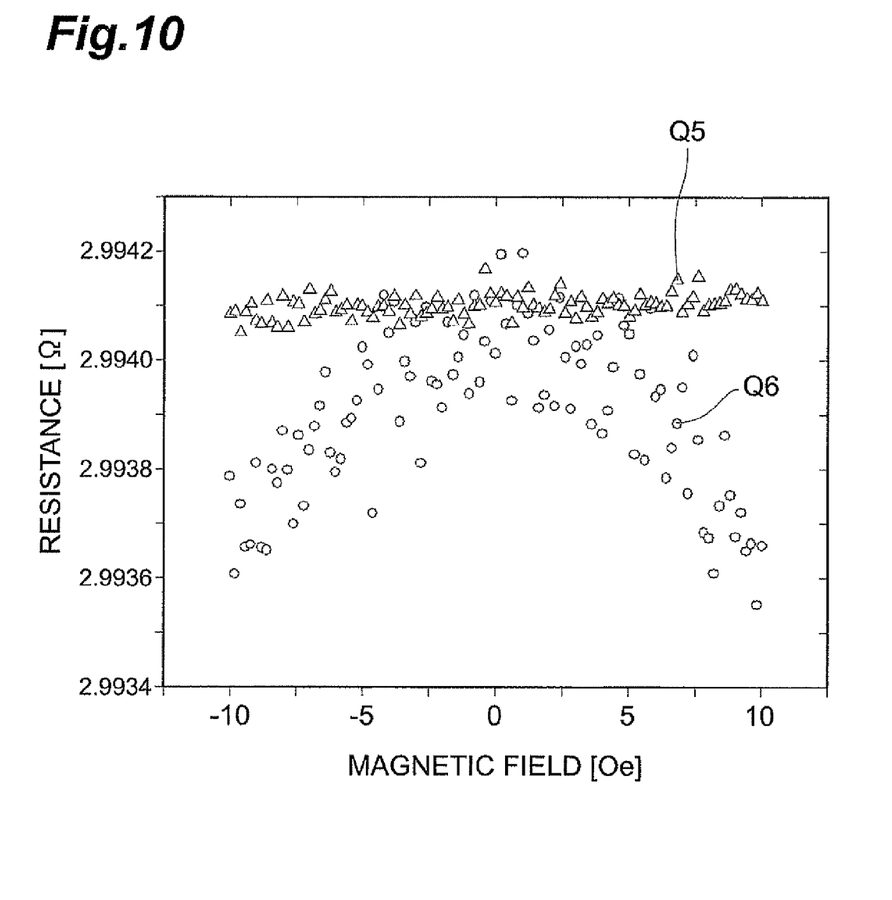
FIG. 10 is a graph showing relations of magnetic field and resistance in Example 2 and Comparative Example 2.

The spin transport elements produced in Example 2 and Comparative Example 2 were also evaluated as to the relations of magnetic field and resistance by the same techniques as in Example 1 and Comparative Example 1 except that the current source was connected to the first ferromagnetic layer 12A and the second ferromagnetic layer 12B to flow an electric current. On this occasion, variation in resistance output obtained between the first ferromagnetic layer 12A and the second ferromagnetic layer 12B was observed with variation in the strength of the external magnetic field H in the Z-axis direction from +10.0 (Oe) to −10.0 (Oe). The evaluation results are shown in FIG. 10. The horizontal axis in FIG. 10 corresponds to the external magnetic field H from the −Z-axis direction applied to the channel layer 7, and the resistance on the vertical axis was measured by the output measuring device connected to the first ferromagnetic layer 12A and the second ferromagnetic layer 12B. Q5 in FIG. 10 corresponds to the measurement result of the spin transport element 10 of Example 2 and Q6 corresponds to the measurement result of the spin transport element of Comparative Example 2. It is also similarly seen in this case that since the spin transport element 10 of Example 2 is provided with the magnetic shield S1, there is little increase or decrease in resistance due to the external magnetic field H applied to the channel layer, when compared with the spin transport element of Comparative Example 2 without the magnetic shield. Since the spin transport element 10 of Example 2 in this configuration is provided with the magnetic shield S1 covering the channel layer 7, the noise or error due to the external magnetic field entering the channel layer is suppressed.

What is claimed is:

1. A spin transport element comprising:
   a first ferromagnet;
   a second ferromagnet;
   a channel having (i) a pair of main surfaces opposing each other and (ii) a pair of side surfaces opposing each other, the first ferromagnet and the second ferromagnet are disposed on one of the main surfaces, the pair of side surfaces extends in a direction from the first ferromagnet to the second ferromagnet, and
   a magnetic shield that covers (i) the one of the main surfaces on which the first ferromagnet and second ferromagnet are disposed and (ii) at least one of the side surfaces, and
   an insulating film provided between the channel and the magnetic shield.

2. The spin transport element according to claim 1, wherein the magnetic shield covers a surface of the channel parallel to a direction of magnetization of the first ferromagnet and a direction of magnetization of the second ferromagnet.

3. The spin transport element according to claim 1, wherein a material of the magnetic shield is a soft magnetic material containing one or more elements selected from the group consisting of Ni, Fe, and Co.

4. The spin transport element according to claim 1, wherein a material of the first ferromagnet and the second ferromagnet is any one of (1) to (3) below:
   (1) a metal selected from the group consisting of Cr, Mn, Co, Fe, and Ni;
   (2) an alloy containing one or more elements selected from the group consisting of Cr, Mn, Co, Fe, and Ni; and
   (3) a compound containing one or more elements selected from the group consisting of Cr, Mn, Co, Fe, and Ni, and one or more elements selected from the group consisting of B, C, and N.

5. The spin transport element according to claim 1, wherein a material of the channel is a material containing one or more semiconductors selected from the group consisting of Si, Ge, GaAs, C, and ZnO.

6. The spin transport element according to claim 1, wherein a barrier layer is formed between at least one of the first ferromagnet and the second ferromagnet, and the channel.

7. The spin transport element according to claim 6, wherein a material of the barrier layer is an oxide material containing at least one of Mg and Al.

8. The spin transport element according to claim 1, wherein a direction of magnetization of at least one of the first ferromagnet and the second ferromagnet is fixed by means of at least one of an antiferromagnet and shape anisotropy.

9. The spin transport element according to claim 1, wherein a coercive force of the first ferromagnet is different from a coercive force of the second ferromagnet.

* * * * *